(12) United States Patent
Aude et al.

(10) Patent No.: US 6,486,821 B1
(45) Date of Patent: Nov. 26, 2002

(54) AMPLIFIER FOR IMPROVING OPEN-LOOP GAIN AND BANDWIDTH IN A SWITCHED CAPACITOR SYSTEM

(75) Inventors: Arlo J. Aude, Atlanta, GA (US); Laurence D. Lewicki, Sunnyvale, CA (US); Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/911,331

(22) Filed: Jul. 23, 2001

(51) Int. Cl.[7] ................................................. H03M 1/12
(52) U.S. Cl. ........................................ 341/172; 327/108
(58) Field of Search ............................ 341/172; 327/65, 327/52, 337, 554, 556; 257/528, 532, 533, 535; 438/957; 330/255

(56) References Cited

U.S. PATENT DOCUMENTS 5,696,459 A * 12/1997 Neugebauer et al. ....... 327/108

* cited by examiner

Primary Examiner—Peguy Jeanpierre
Assistant Examiner—Joseph J Lauture

(57) ABSTRACT

There is disclosed an amplifier for operating from a power supply having a first voltage level. The amplifier comprises: 1) a plurality of thick-oxide field effect transistors, each of the plurality of thick-oxide field effect transistors having a relatively thick oxide layer and fabricated using a first process such that the each thick-oxide field effect transistor can withstand a gate-to-source difference, a gate-to-drain difference, and a gate-to-bulk difference at least equal to a first maximum operating voltage, wherein the first. maximum operating voltage is at least equal to the first voltage level; and 2) a first thin-oxide field effect transistor coupled to a first input of the amplifier, the first thin-oxide field effect transistor having a relatively thin oxide layer and fabricated using a second process such that the first thin-oxide field effect transistor can withstand a gate-to-source difference, a gate-to-drain difference, and a gate-to-bulk difference at least equal to a second maximum operating voltage, wherein the second maximum operating voltage is less than the first voltage level.

14 Claims, 4 Drawing Sheets

AMPLIFIER FOR IMPROVING OPEN-LOOP GAIN AND BANDWIDTH IN A SWITCHED CAPACITOR SYSTEM

TECHNICAL FIELD OF THE INVENTION

The present invention is generally directed to switched capacitor systems and, in particular, to an amplifier for improving the open-loop gain and bandwidth of a switched capacitor system.

BACKGROUND OF THE INVENTION

Switched capacitor systems are used in a wide variety of applications, including digital-to-analog converter (DAC) circuits, analog-to-digital converter (ADC) circuits, equalizers, filters, and the like. A switched capacitor system typically comprises an operational amplifier (i.e., op-amp) with a first output (or feedback) capacitor (COUT1) coupled (directly or indirectly) between a first output and a first input of the op-amp and a first input capacitor (CIN1) coupled (directly or indirectly) between the first input and ground. The switched capacitor system also may comprise a second output (or feedback) capacitor (COUT2) coupled (directly or indirectly) between a second output and a second input of the op-amp and a second input capacitor (CIN2) coupled (directly or indirectly) between the second input and ground.

Through a series of switching operations, charge is distributed on these capacitors to effect a closed loop gain. This closed loop gain is subject to a finite error caused by the non-ideal open-loop gain of the operational amplifier. The open-loop frequency response is also attenuated by the capacitive voltage divider produced at the input between the feedback capacitor and the capacitor to ground. The effective capacitance of the capacitor to ground is equal to the sum of the capacitance of the fixed external capacitor and the input (parasitic) capacitance of the operational amplifier. Generally, the input parasitic capacitance is predominantly caused by the gate-to-source capacitance of MOSFET devices in the operational amplifier. Hereafter, the input parasitic capacitance may be approximated by using the gate-to-source capacitance interchangeably.

In any given system, reduction of the op-amp input capacitance reduces the capacitance voltage division at this node and improves the open-loop gain and bandwidth of the system. Reducing the op-amp input capacitance may be achieved by making the input transistors of the op-amp smaller. However, reducing op-amp input capacitance is problematic when dealing with very small devices. Very small channel length devices typically have higher gains than larger channel devices. However, small channel length devices (i.e., 0.18 micron) are unable to withstand large operating voltages. Hence, small channel length devices typically operate from a 1.6 volt to 2.0 volt power supply, while larger channel length device (i.e., 0.4 micron) typically operate from a 2.7 volt to 3.6 volt power supply. Thus, reducing the device size in order to reduce input capacitance often entails reducing the power supply. Since a reduced power supply results in reduced performance of the op-amp transistors, at least part of the benefit of reducing input capacitance is lost.

Therefore, there is a need in the art for an improved operational amplifier for use in switched capacitor systems. In particular, there is a need for an operational amplifier having a reduced input capacitance that is still able to operate from higher power supply voltages.

SUMMARY OF THE INVENTION

To address the above-discussed deficiencies of the prior art, it is a primary object of the present invention to provide an operational amplifier that has both thick-oxide transistors and thin-oxide transistor and operates from a high voltage supply. The present invention replaces a thick oxide transistor with a thin oxide transistor having smaller width (W) and length (L) at the input of the op-amp. Since the capacitance of the oxide (Cox) is inversely proportional to the thickness of the oxide (Tox), the thin-oxide input transistor would actually have increased input parasitic capacitance per square micron, if all other factors are the same.

To maintain the same amplifier characteristics, the W/L ratio of the transistors may be held constant. However, W and L are reduced proportionally. If the product, W×L×Cox, is lower for the thin oxide device, then replacing a thick-oxide transistor with a thin-oxide transistor having much smaller area decreases the overall input capacitance of the op-amp, thereby improving open-loop gain and bandwidth.

As an example, consider an operational amplifier that has two device (i.e., transistor) types. The first device has a minimum L=0.4, Tox=70 A, and a Cox=5 fF/um$^2$. The second device has a minimum L=0.2, Tox=35 A, and a Cox=10 fF/um$^2$. For a given W=40 and L=0.4, the first device has a parasitic capacitance, Cp1 (e.g., approximately equal to gate-to-source capacitance, Cgs), of 0.4(40) (5 fF)=80 fF. If the second is scaled to obtain the same W/L ratio, with minimum L=0.2 and W=18, then the second has a parasitic capacitance Cp2=Cgs=0.2(18)(10 fF)=40 fF. Assume the output (feedback) capacitor, COUT, is 80 fF and the input capacitor to ground, CIN, is 80 fF. Therefore, the voltage division at the input of the op-amp is 80/160=0.5 for the first device. The voltage division at the input of the op-amp is 80/120=0.67 for the second device. This represents an improvement of 1.34 over the first device (or a 2.5 dB improvement in open-loop gain). Similarly, bandwidth is improved.

The present invention is able to use thin-oxide devices in an operational amplifier operating from a large power supply by replacing only devices that are not exposed to the full power supply voltage. For example, replacing some of the N-type transistors in an input differential pair of the op-amp allows such a switched-cap amplifying system to obtain improved open-loop gain and bandwidth using thin oxide devices while maintaining a power supply voltage suitable for use with the thick oxide devices. The biasing of the cascade transistors and other devices in the operational amplifier must be such that the thin-oxide transistors in the differential pair never see more than, for example, a 1.8 volt gate-to-source difference, gate-to-drain difference, or gate-to-bulk difference.

Thus, according to an advantageous embodiment of the present invention, there is provided an amplifier capable of operating from a power supply having a first voltage level, wherein the amplifier comprises: 1) a plurality of thick-oxide field effect transistors, each of the plurality of thick-oxide field effect transistors having a relatively thick oxide layer and fabricated using a first process such that the each thick-oxide field effect transistor is capable of withstanding a gate-to-source difference and a gate-to-drain difference at least equal to a first maximum operating voltage, wherein the first maximum operating voltage is at least equal to the first voltage level; and 2) a first thin-oxide field effect transistor coupled to a first input of the amplifier, the first thin-oxide field effect transistor having a relatively thin oxide layer and fabricated using a second process such that the first thin-oxide field effect transistor is capable of withstanding a gate-to-source difference, a gate-to-drain difference, and a gate-to-bulk difference at least equal to a second maximum operating voltage, wherein the second maximum operating voltage is less than the first voltage level.

According to one embodiment of the present invention, a configuration of the plurality of thick-oxide field effect transistors and the first thin-oxide field effect transistor prevents the first thin-oxide field effect transistor from being exposed to a gate-to-source difference greater than the second maximum operating voltage.

According to another embodiment of the present invention, the configuration of the plurality of thick-oxide field effect transistors and the first thin-oxide field effect transistor prevents the first thin-oxide field effect transistor from being exposed to at least one of a gate-to-drain difference and a gate-to-bulk difference greater than the second maximum operating voltage.

According to still another embodiment of the present invention, the amplifier further comprises a second thin-oxide field effect transistor coupled to a second input of the amplifier, the second thin-oxide field effect transistor having a relatively thin oxide layer and fabricated using the second process such that the second thin-oxide field effect transistor is capable of withstanding a gate-to-source difference, a gate-to-drain difference, and a gate-to-bulk difference at least equal to the second maximum operating voltage.

According to yet another embodiment of the present invention, a configuration of the plurality of thick-oxide field effect transistors and the second thin-oxide field effect transistor prevents the second thin-oxide field effect transistor from being exposed to a gate-to-source difference greater than the second maximum operating voltage.

According to a further embodiment of the present invention, the configuration of the plurality of thick-oxide field effect transistors and the second thin-oxide field effect transistor prevents the second thin-oxide field effect transistor from being exposed to at least one of a gate-to-drain difference and a gate-to-bulk difference greater than the second maximum operating voltage.

According to a still further embodiment of the present invention, the first and second thin-oxide field effect transistors comprise a differential pair input stage.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged operational amplifier.

Figure 1:
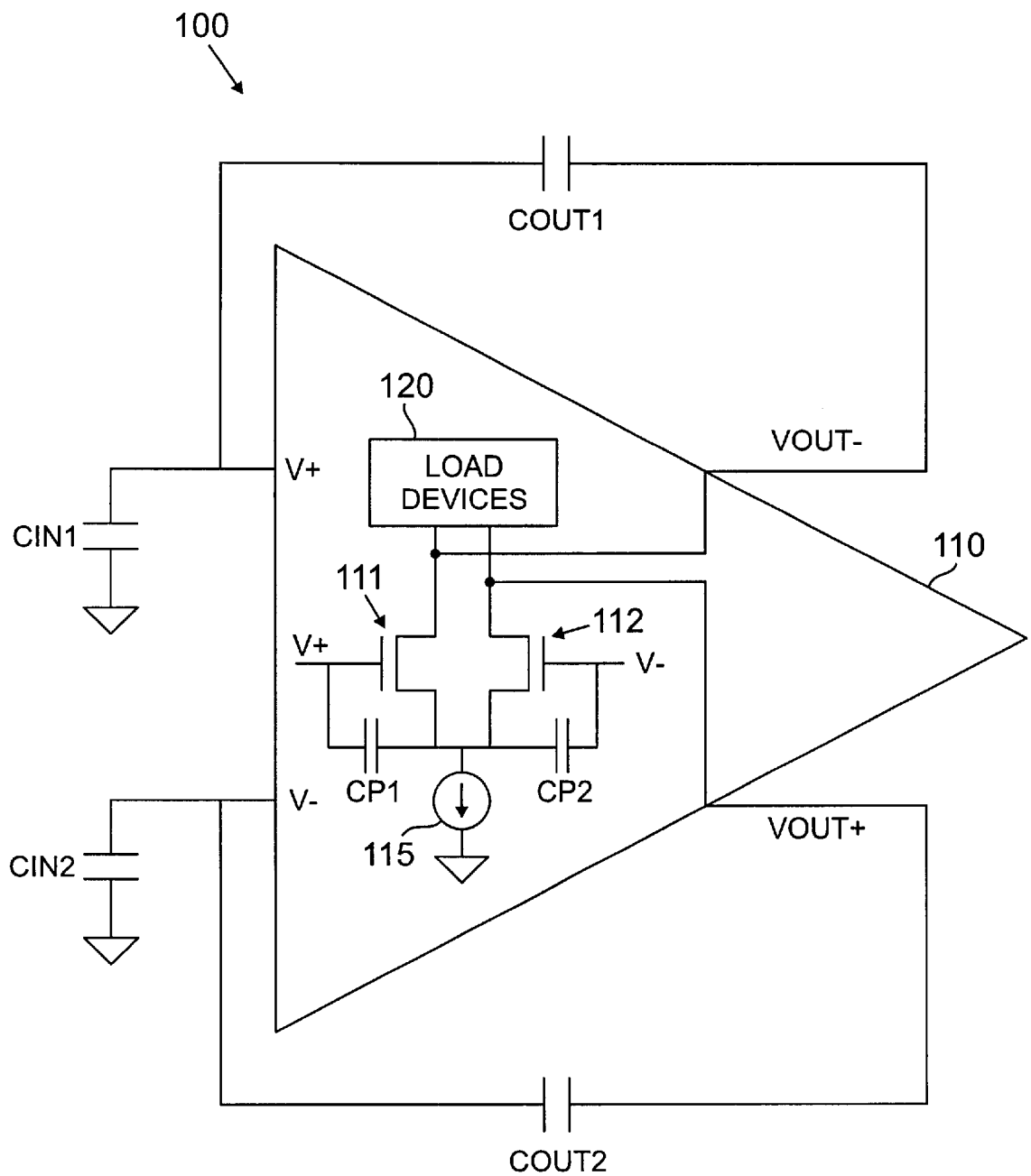
FIG. 1 illustrates selected portions of an operational amplifier in a switched capacitor system according to one embodiment of the present invention.

FIG. 1 illustrates selected portions of operational amplifier 110 in switched capacitor system 100 according to one embodiment of the present invention. Switched capacitor system 100 comprises operational amplifier (i.e., op-amp) 110, which has a non-inverting input (V+), an inverting input (V−), a non-inverting output (VOUT+) and an inverting output (VOUT−). Output (or feedback) capacitor (COUT1) is coupled between the VOUT− output and the V+ input. Input capacitor (CIN1) is coupled (directly or indirectly) between the V+ input and ground. Output (or feedback) capacitor (COUT2) is coupled (directly or indirectly) between the VOUT+ output and the V− input of op-amp 110. Input capacitor (CIN2) is coupled (directly or indirectly) between the V− input and ground.

Op-amp 110 comprises a differential input pair (i.e., N-type MOSFET transistor 111 and N-type MOSFET transistor 112), bias current source 115, and load devices 120. The input parasitic capacitance of N-type transistor 111 is represented by capacitor CP1. The input parasitic capacitance of transistor 112 is represented by capacitor CP2. The gate of transistor 111 is coupled to the V+ input and the gate of transistor 112 is coupled to the V− input. According to the principles of the present invention, transistors 111 and 112 are thin-oxide devices, while many other N-type and P-type MOSFET transistors in op-amp 110, including biasing transistors (not shown) and load devices 120, are thick-oxide devices. According to the principles of the present invention, the voltage drops across other devices and the internal bias voltages in op-amp 110 are such that transistors 111 and 112 (and other thin-oxide devices, if any) do not see a large voltage difference. Thus, op-amp 110 can operate from a +3.3 volt power supply, while N-type transistors 111 and 112 may only be, for example, +1.8 volt process devices.

Figure 2:
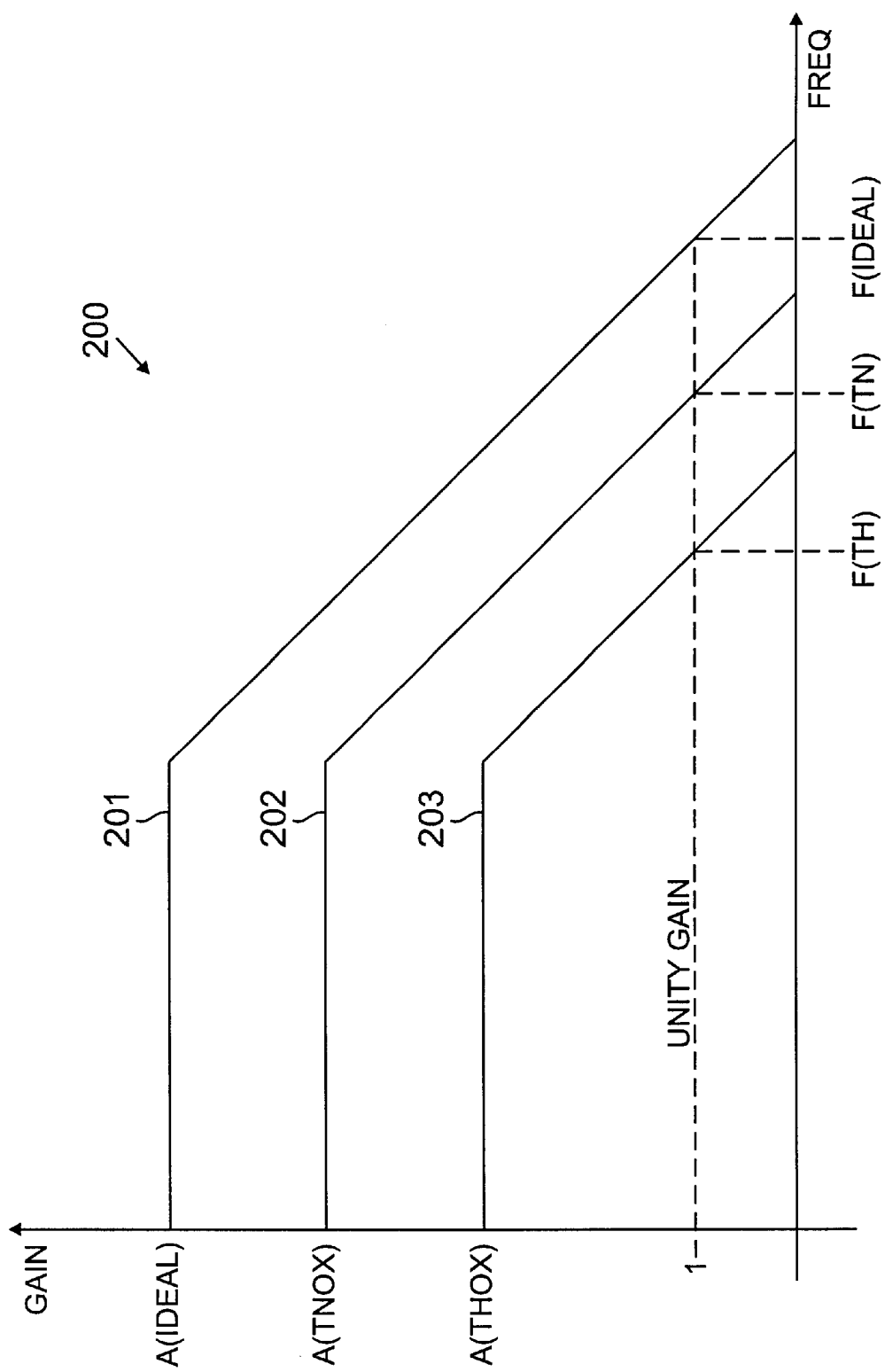
FIG. 2 is a graph illustrating the improved performance characteristics of an operational amplifier containing thick-oxide devices and thin-oxide devices according to the principles of the present invention.

FIG. 2 depicts graph 200, which illustrates the improved performance characteristics of operational amplifier 110 containing thin-oxide MOSFET devices in place of thin-oxide devices according to the principles of the present invention. curve 201 illustrates the ideal gain, A(Ideal), of op-amp 110. Curve 203 illustrates the gain, A(ThOx), of op-amp 110 using only thick-oxide devices. Curve 202 illustrates the gain, A(TnOx), of op-amp 110 using thin-oxide devices in place of selected thick-oxide devices in the inputs of op-amp 110.

The ideal gain, A(Ideal) of op-amp 110 is a scaled version of the open-loop gain (AOL) and is given by:

$$A(Ideal)=AOL \times (COUT)/(CIN+COUT) \qquad \text{Eqn. 1}$$

The thick-oxide gain, A(ThOx), is given by:

$$A(ThOx)=AOL \times (COUT)/(CIN+COUT+CP(ThOx)) \qquad \text{Eqn. 2}$$

The thin-oxide gain, A(TnOx), is given by:

$$A(TnOx)=AOL \times (COUT)/(CIN+COUT+CP(TnOx)) \qquad \text{Eqn. 3}$$

Since CP(TnOx) is smaller than CP(ThOx), the denominator of Equation 3 above is smaller that the denominator of Equation 2 above. Thus, the thin-oxide gain is larger than the thick-oxide gain and curve 202 is higher (closer to ideal) than curve 203. Similarly, at unity gain (i.e., A=1), the frequency, F(Tn), of the thin-oxide device gives a greater bandwidth than the frequency F(Th) of thick-oxide device.

Figure 3:
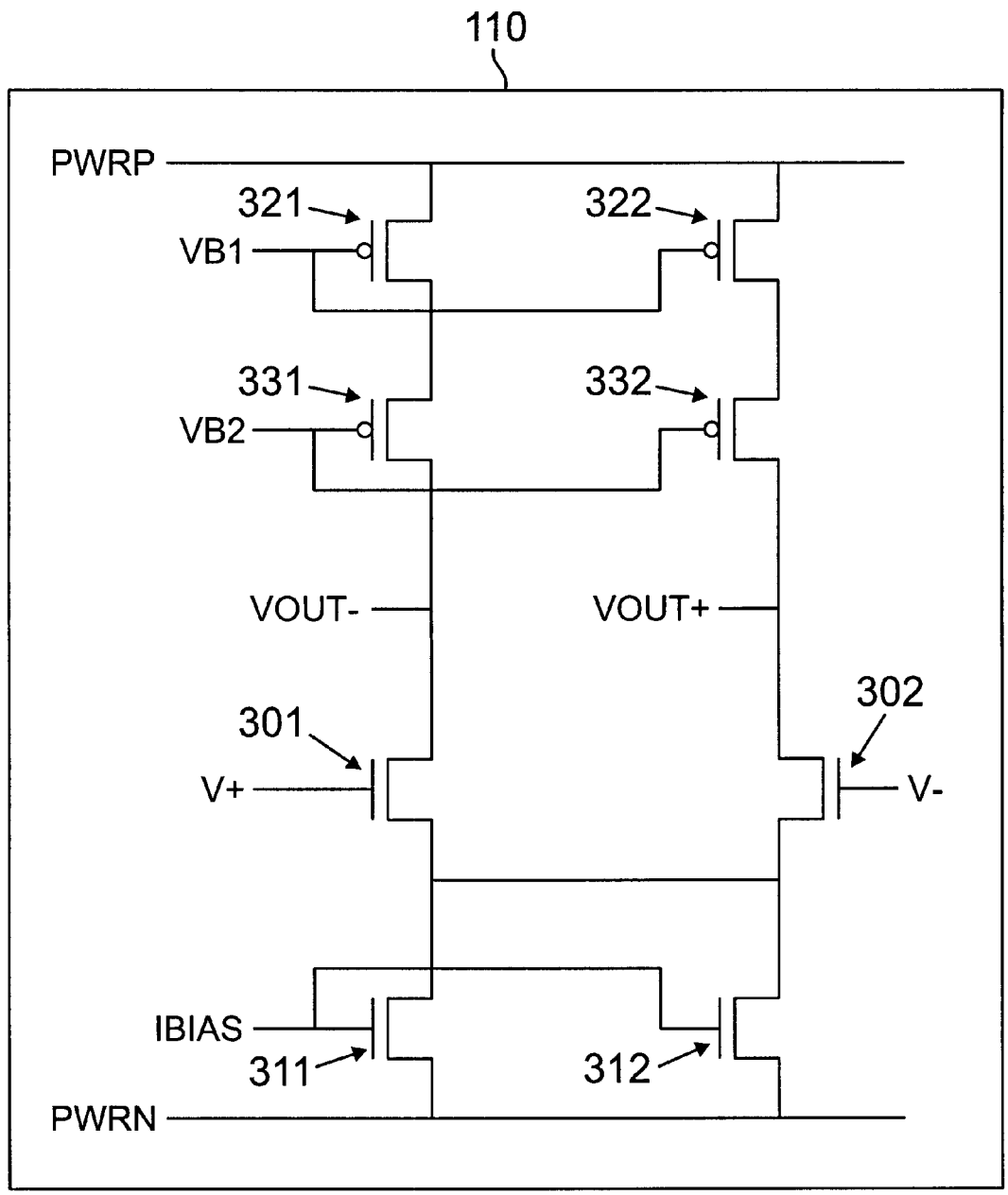
FIG. 3 illustrates selected portions of an exemplary operational amplifier containing thin-oxide and thick-oxide devices according to a first embodiment of the present invention.

FIG. 3 illustrates selected portions of one stage of exemplary operational amplifier 110 containing thin-oxide and thick-oxide MOSFET devices according to a first embodiment of the present invention. Other stages in op-amp 110 are not shown. In the exemplary embodiment, the positive power supply rail, PWRP, is, for example, +3.3 volts, and the negative power supply rail is grounded.

Op-amp 110 comprises N-type transistors 301 and 302, which form a differential input pair, and N-type transistors 311 and 312, which form a constant bias current source. The bias current, $I_{BIAS}$, is determined by the bias voltage signal, IBIAS. The drains of transistors 301 and 302 are coupled (directly or indirectly) to the drains of P-type transistors 331 and 332, respectively. P-type transistor 331 is connected in a cascade arrangement with P-type transistor 321. P-type transistor 332 is connected in a cascode arrangement with P-type transistor 322. The gates of P-type transistors 321 and 322 are driven by the bias voltage VB1. Similarly, the gates of P-type transistors 331 and 332 are driven by the bias voltage VB2.

According to the principle of the present invention, differential pair N-type transistors 301 and 302 and bias N-type z transistors 311 and 312 may be implemented as thin-oxide devices while P-type transistors 321, 322, 331, and 332 are implemented as thick-oxide devices. For example, N-type transistors 301, 302, 311, and 312 may be made using a 0.18 micron process that can tolerate a drain-to-gate voltage, a gate-to-source voltage, or a gate-to-bulk voltage of +1.8 volts or less. However, even though PWRP may be +3.3 volts, N-type transistors 301 and 302 are not damaged because the other circuits in op-amp 110, including cascode P-type transistors 321, 322, 331, and 332 operate in such a manner that N-type transistors 301, 302, 311, and 312 are never exposed to greater than +1.8 volts. P-type transistors 321, 322, 331, and 332 are thick-oxide devices made using a process that can tolerate a drain-to-gate voltage, a gate-to-source voltage, or a gate-to-bulk of +3.3 volts or less.

Figure 4:
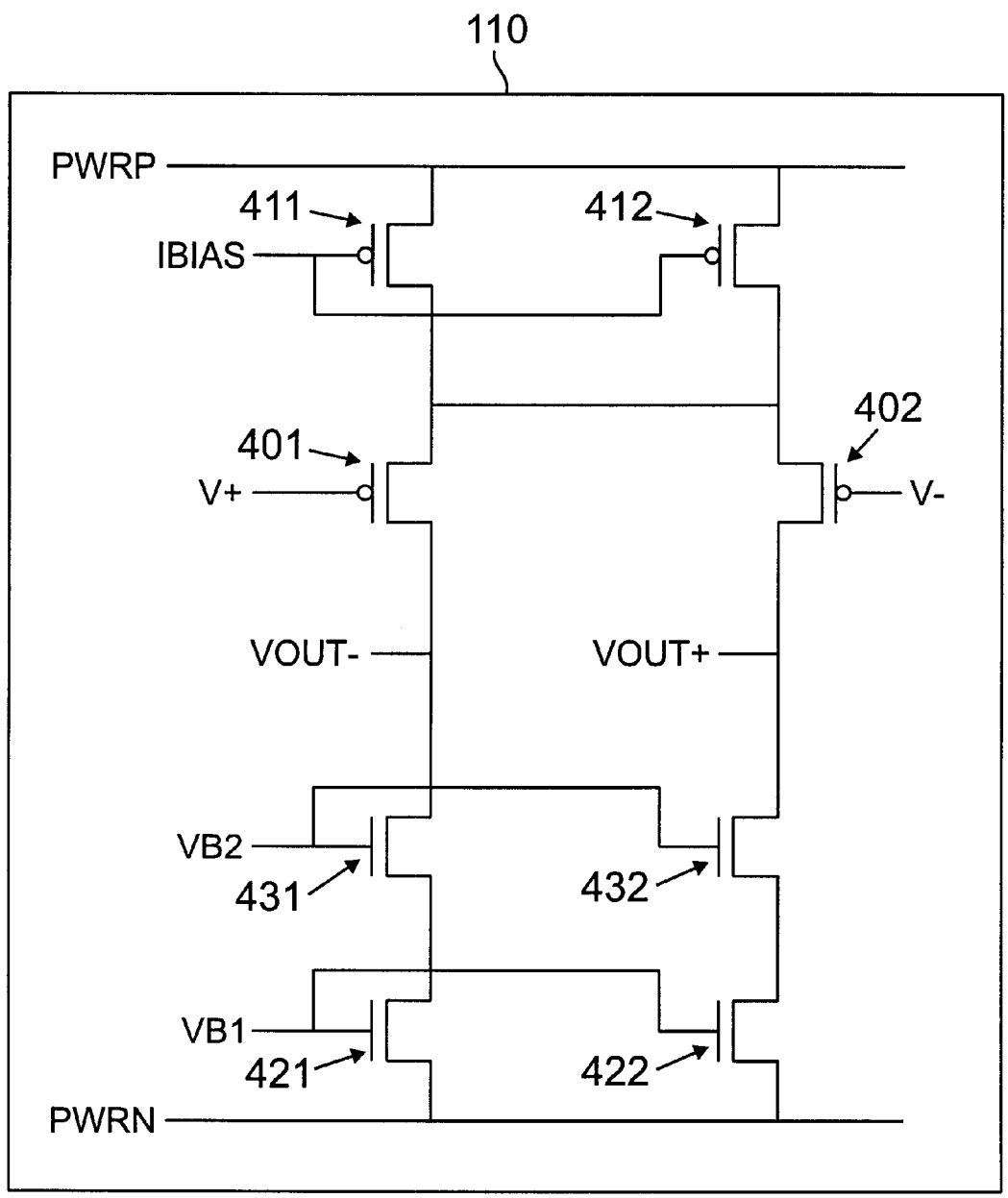
FIG. 4 illustrates selected portions of an exemplary operational amplifier containing thin-oxide and thick-oxide devices according to a second embodiment of the present invention.

FIG. 4 illustrates selected portions of one stage of exemplary operational amplifier 110 containing thin-oxide and thick-oxide MOSFET devices according to a second embodiment of the present invention. Other stages in op-amp 110 are not shown. In the exemplary embodiment, the positive power supply rail, PWRP, is, for example, +3.3 volts, and the negative power supply rail is grounded.

Op-amp 110 comprises P-type transistors 401 and 402, which form a differential input pair, and P-type transistors 411 and 412, which form a constant bias current source. The bias current, $I_{BIAS}$, is determined by the bias voltage signal, IBIAS. The drains of transistors 401 and 402 are coupled (directly or indirectly) to the drains of N-type transistors 431 and 432, respectively. N-type transistor 431 is connected in a cascode arrangement with N-type transistor 421. N-type transistor 432 is connected in a cascode arrangement with N-type transistor 422. The gates of N-type transistors 421 and 422 are driven by the bias voltage VB1. Similarly, the gates of N-type transistors 431 and 432 are driven by the bias voltage VB2.

According to the principle of the present invention, differential pair P-type transistors 401 and 402 and bias P-type transistors 411 and 312 may be implemented as thin-oxide devices while N-type transistors 421, 422, 431, and 432 are implemented as thick-oxide devices. For example, P-type transistors 401, 402, 411, and 412 may be made using a 0.18 micron process that can tolerate a drain-to-gate voltage, a gate-to-source voltage, or a gate-to-bulk voltage of +1.8 volts or less. However, even though PWRP may be +3.3 volts, P-type transistors 401 and 402 are not damaged because the other circuits in op-amp 110, including cascode P-type transistors 421, 422, 431, and 432 operate in such a manner that N-type transistors 401, 402, 411, and 412 are never exposed to greater than +1.8 volts. P-type transistors 421, 422, 431, and 432 are thick-oxide devices made using a process that can tolerate a drain-to-gate voltage, a gate-to-source voltage, or a gate-to-bulk voltage of +3.3 volts or less.

It would be impossible to set forth herein all possible ways of arranging and biasing the thick-oxide devices in op-amp 110 so that the thin-oxide devices are not exposed to high voltages. However, those skilled in the art will no doubt be familiar with a myriad number of well-known ways of arranging and biasing the thick-oxide devices to protect the thin-oxide devices. Thus, it should be understood that the principles of the present invention may be implemented in many different amplifier architectures and that no particular amplifier circuit design is required or preferred.

Although the present invention has been described in detail, those skilled in the art should understand that they can make various changes, substitutions and alterations herein without departing from the spirit and scope of the invention in its broadest form.

What is claimed is:

1. An amplifier capable of operating from a power supply having a first voltage level, said amplifier comprising:
   a plurality of thick-oxide field effect transistors, each of said plurality of thick-oxide field effect transistors having a relatively thick oxide layer and fabricated using a first process such that said each thick-oxide field effect transistor is capable of withstanding a gate-to-source difference, a gate-to-drain difference, and a gate-to-bulk difference at least equal to a first maximum operating voltage, wherein said first maximum operating voltage is at least equal to said first voltage level; and a first thin-oxide field effect transistor coupled to a first input of said amplifier, said first thin-oxide field effect transistor having a relatively thin oxide layer and fabricated using a second process such that said first thin-oxide field effect transistor is capable of withstanding a gate-to-source difference, a gate-to-drain difference, and a gate-to-bulk difference at least equal to a second maximum operating voltage, wherein said second maximum operating voltage is less than said first voltage level.

2. The amplifier as set forth in claim 1 wherein a configuration of said plurality of thick-oxide field effect transistors and said first thin-oxide field effect transistor prevents said first thin-oxide field effect transistor from being exposed to at least one of a gate-to-source difference and a gate-to-bulk difference greater than said second maximum operating voltage.

3. The amplifier as set forth in claim 2 wherein said configuration of said plurality of thick-oxide field effect transistors and said first thin-oxide field effect transistor prevents said first thin-oxide field effect transistor from being exposed to a gate-to-drain difference greater than said second maximum operating voltage.

4. The amplifier as set forth in claim 3 further comprising a second thin-oxide field effect transistor coupled to a second input of said amplifier, said second thin-oxide field effect transistor having a relatively thin oxide layer and fabricated using said second process such that said second thin-oxide field effect transistor is capable of withstanding a gate-to-source difference, a gate-to-drain difference, and a gate-to-bulk difference at least equal to said second maximum operating voltage.

5. The amplifier as set forth in claim 4 wherein a configuration of said plurality of thick-oxide field effect transistors and said second thin-oxide field effect transistor prevents said second thin-oxide field effect transistor from being exposed to a gate-to-source difference greater than said second maximum operating voltage.

6. The amplifier as set forth in claim 5 wherein said configuration of said plurality of thick-oxide field effect transistors and said second thin-oxide field effect transistor prevents said second thin-oxide field effect transistor from being exposed to at least one of a gate-to-drain difference and a gate-to-bulk difference greater than said second maximum operating voltage.

7. The amplifier as set forth in claim 6 wherein said first and second thin-oxide field effect transistors comprise a differential pair input stage.

8. A switched capacitor system comprising:

an amplifier capable of operating from a power supply having a first voltage level, said amplifier comprising a non-inverting input, an inverting input, a non-inverting output, and an inverting output;

a first output capacitor coupled between said non-inverting input and said inverting output;

a second output capacitor coupled between said inverting input and said non-inverting output;

a first input capacitor coupled between said non-inverting input and ground; and a second input capacitor coupled between said inverting input and ground, wherein said amplifier further comprises:

a plurality of thick-oxide field effect transistors, each of said plurality of thick-oxide field effect transistors having a relatively thick oxide layer and-fabricated using a first process such that said each thick-oxide field effect transistor is capable of withstanding a gate-to-source difference, a gate-to-drain difference, and a gate-to-bulk difference at least equal to a first maximum operating voltage, wherein said first maximum operating voltage is at least equal to said first voltage level; and a first thin-oxide field effect transistor coupled to said non-inverting input, said first thin-oxide field effect transistor having a relatively thin oxide layer and fabricated using a second process such that said first thin-oxide field effect transistor is capable of withstanding a gate-to-source difference, a gate-to-drain difference, and a gate-to-bulk difference at least equal to a second maximum operating voltage, wherein said second maximum operating voltage is less than said first voltage level.

9. The switched capacitor system as set forth in claim 8 wherein a configuration of said plurality of thick-oxide field effect transistors and said first thin-oxide field effect transistor prevents said first thin-oxide field effect transistor from being exposed to a gate-to-source difference greater than said second maximum operating voltage.

10. The switched capacitor system as set forth in claim 9 wherein said configuration of said plurality of thick-oxide field effect transistors and said first thin-oxide field effect transistor prevents said first thin-oxide field effect transistor from being exposed to at least one of a gate-to-drain difference and a gate-to-bulk difference greater than said second maximum operating voltage.

11. The switched capacitor system as set forth in claim 10 further comprising a second thin-oxide field effect transistor coupled to said inverting input, said second thin-oxide field effect transistor having a relatively thin oxide layer and fabricated using said second process such that said second thin-oxide field effect transistor is capable of withstanding a gate-to-source difference, a gate-to-drain difference, and a gate-to-bulk difference at least equal to said second maximum operating voltage.

12. The switched capacitor system as set forth in claim 11 wherein a configuration of said plurality of thick-oxide field effect transistors and said second thin-oxide field effect transistor prevents said second thin-oxide field effect transistor from being exposed to a gate-to-source difference greater than said second maximum operating voltage.

13. The switched capacitor system as set forth in claim 12 wherein said configuration of said plurality of thick-oxide field effect transistors and said second thin-oxide field effect transistor prevents said second thin-oxide field effect transistor from being exposed to at least one of a gate-to-drain difference and a gate-to-bulk difference greater than said second maximum operating voltage.

14. The switched capacitor system as set forth in claim 13 wherein said first and second thin-oxide field effect transistors comprise a differential pair input stage.

* * * * *